(12) United States Patent
Nicholes et al.

(10) Patent No.: US 9,460,770 B1
(45) Date of Patent: Oct. 4, 2016

(54) METHODS OF OPERATING FERROELECTRIC MEMORY CELLS, AND RELATED FERROELECTRIC MEMORY CELLS

(71) Applicant: Micron Technology, Inc., Boise, ID (US)

(72) Inventors: Steven C. Nicholes, Meridian, ID (US); Ashonita A. Chavan, Boise, ID (US); Matthew N. Rocklein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/842,124

(22) Filed: Sep. 1, 2015

(51) Int. Cl.
| | |
|---|---|
| *G11C 11/22* | (2006.01) |
| *H01L 27/115* | (2006.01) |
| *G11C 11/56* | (2006.01) |
| *G11C 13/04* | (2006.01) |
| *G11C 14/00* | (2006.01) |

(52) U.S. Cl.
CPC .............. *G11C 11/225* (2013.01); *G11C 11/22* (2013.01); *G11C 11/221* (2013.01); *G11C 11/5657* (2013.01); *G11C 13/047* (2013.01); *H01L 27/11502* (2013.01); *G11C 14/00* (2013.01)

(58) Field of Classification Search
CPC ... G11C 11/22; G11C 11/5657; G11C 14/00; G11C 13/047
USPC ................................................. 365/145, 117
See application file for complete search history.

(56) References Cited

U.S. PATENT DOCUMENTS

| | | | |
|---|---|---|---|
| 5,962,884 A | 10/1999 | Hsu et al. | |
| 6,016,266 A | 1/2000 | Nishimura | |
| 6,495,878 B1 * | 12/2002 | Hayashi | H01L 27/0629 257/295 |
| 6,635,498 B2 | 10/2003 | Summerfelt et al. | |
| 6,674,110 B2 | 1/2004 | Gnadinger | |
| 6,730,950 B1 * | 5/2004 | Seshadri | H01L 21/76895 257/295 |
| 6,872,998 B2 * | 3/2005 | Hirano | H01L 27/11502 257/296 |
| 6,992,913 B2 | 1/2006 | Yamada et al. | |
| 6,995,025 B2 | 2/2006 | Hsu et al. | |
| 7,049,646 B2 * | 5/2006 | Zambrano | H01L 27/11502 257/295 |

(Continued)

FOREIGN PATENT DOCUMENTS

JP    2003243741 A    8/2003

OTHER PUBLICATIONS

Muller et al., Ferroelectric Hafnium Oxide: A CMOS-Compatible and Highly Scalable Approach to Future Ferroelectric Memories, DOI: 10.1109/IEDM.2013.6724605 Conference: Technical Digest International Electron Devices Meeting 2013, At Washington D.C., vol. 2013, 4 pages.

*Primary Examiner* — Pho M Luu
(74) *Attorney, Agent, or Firm* — TraskBritt

(57) ABSTRACT

Methods of operating a ferroelectric memory cell. The method comprises applying one of a positive bias voltage and a negative bias voltage to a ferroelectric memory cell comprising a capacitor including a top electrode, a bottom electrode, a ferroelectric material between the top electrode and the bottom electrode, and an interfacial material between the ferroelectric material and one of the top electrode and the bottom electrode. The method further comprises applying another of the positive bias voltage and the negative bias voltage to the ferroelectric memory cell to switch a polarization of the ferroelectric memory cell, wherein an absolute value of the negative bias voltage is different from an absolute value of the positive bias voltage. Ferroelectric memory cells are also described.

23 Claims, 13 Drawing Sheets

(56) References Cited

U.S. PATENT DOCUMENTS

| | | |
|---|---|---|
| 7,052,941 B2 | 5/2006 | Lee |
| 7,142,445 B2 | 11/2006 | Hamada et al. |
| 7,196,924 B2 | 3/2007 | Lai et al. |
| 7,535,745 B2 | 5/2009 | Shuto |
| 7,796,494 B2 | 9/2010 | Zhao et al. |
| 7,927,889 B2 | 4/2011 | Mitsui |
| 7,935,543 B2 | 5/2011 | Moise, IV et al. |
| 8,210,658 B2 | 7/2012 | Arakawa et al. |
| 8,492,742 B2 | 7/2013 | Tamai |
| 8,531,862 B2 | 9/2013 | Roest et al. |
| 8,901,701 B2 * | 12/2014 | Lin ................ H01L 21/76898 257/522 |
| 9,053,801 B2 | 6/2015 | Sandhu et al. |
| 2002/0191435 A1 | 12/2002 | Nordal |
| 2004/0209420 A1 | 10/2004 | Ljungcrantz et al. |
| 2007/0018328 A1 | 1/2007 | Hierlemann et al. |
| 2014/0061568 A1 | 3/2014 | Ramaswamy et al. |
| 2014/0340952 A1 | 11/2014 | Ramaswamy et al. |
| 2015/0076437 A1 | 3/2015 | Tao et al. |
| 2015/0137063 A1 | 5/2015 | Ramaswamy et al. |

\* cited by examiner

METHODS OF OPERATING FERROELECTRIC MEMORY CELLS, AND RELATED FERROELECTRIC MEMORY CELLS

TECHNICAL FIELD

Embodiments disclosed herein relate to methods of operating ferroelectric memory cells including ferroelectric materials exhibiting asymmetric ferroelectric properties, and to such ferroelectric memory cells.

BACKGROUND

Ferroelectric random-access memory (FeRAM) cells have been considered for use in many memory arrays. FeRAM cells include a ferroelectric material having a switchable polarization responsive to application of an electric field (e.g., a bias voltage). The polarization state of the ferroelectric material in the FeRAM cell may be used to determine a logic state (e.g., a 1 or a 0) of the FeRAM cell. After the bias voltage is removed, the polarization of the ferroelectric material may remain. The FeRAM cell is therefore, non-volatile, eliminating the need to refresh the memory cell periodically.

Conventional FeRAM cells under an applied field theoretically exhibit a square hysteresis loop 102, as illustrated in FIG. 1, since atoms of the ferroelectric material transition between two equally favorable states. The FeRAM cell is switched from one operational state to another operational state by exposing the FeRAM cell to a switching bias voltage. For example, the ferroelectric material may be exposed to a positive voltage to switch the polarization of the ferroelectric material to a first direction. At a large enough positive voltage (characterized as the positive switching voltage), the polarization of the ferroelectric material switches from a negative polarization to a positive polarization. To switch the FeRAM cell to another state, the ferroelectric material is exposed to a negative switching voltage to change the polarization of the ferroelectric material to a second, opposite direction. Conventionally, the positive switching voltage and the negative switching voltage applied to a conventional FeRAM cell are equal in magnitude (e.g., have the same absolute value, also referred to herein as a symmetric biasing scheme).

Unfortunately, many FeRAM cells require utilization of a high bias voltage to switch between different polarization states. Any power savings realized by the non-volatility of the FeRAM cell relative to a DRAM cell are offset by the high bias voltages that must be applied to switch the polarization state of the ferroelectric material. Thus, exposing the ferroelectric materials to the higher voltages increases power consumption of the FeRAM cells, increases operating costs, and may also decrease the useful life of the FeRAM cells.

DETAILED DESCRIPTION

Figure 1:
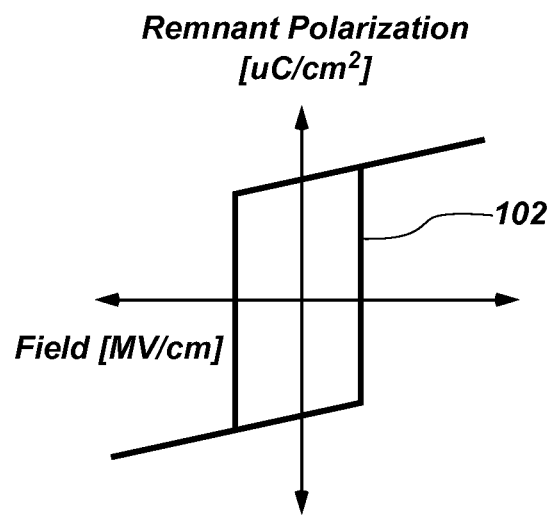
FIG. 1 is a hysteresis curve during use and operation of a conventional ferroelectric memory cell.

The illustrations included herewith are not meant to be actual views of any particular systems or semiconductor devices, but are merely idealized representations that are employed to describe embodiments herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing ferroelectric memory cells, and the ferroelectric memory cells described below do not form a complete ferroelectric memory cell. Only those process acts and structures necessary to understand the embodiments described herein are described in detail below. Additional acts to form a complete ferroelectric memory cell may be performed by conventional techniques.

As used herein, the term "switching voltage" means and includes a bias voltage applied between a pair of electrodes (e.g., of a capacitor) sufficient to switch a polarization state of a ferroelectric material disposed between the pair of electrodes. The bias voltage may be a positive bias voltage, in which case the switching voltage is referred to as a "positive switching voltage," or the bias voltage may be a negative bias voltage, in which case the switching voltage is referred to as a "negative switching voltage."

According to some embodiments, a method of operating a ferroelectric memory cell by applying an asymmetric biasing scheme is disclosed. The ferroelectric memory cell may be asymmetric and may exhibit asymmetric switching characteristics. As used herein, the term "asymmetric ferroelectric memory cell" means and includes a memory cell including a ferroelectric material disposed between two electrodes. The asymmetric ferroelectric memory cell may include an interfacial material between one of the electrodes and the ferroelectric material. In some embodiments, each of the electrodes also has different thicknesses or is formed by different methods.

As used herein, the term "asymmetric biasing scheme" means and includes applying a bias voltage (e.g., a potential) across the electrodes of a ferroelectric memory cell to switch a polarization of the ferroelectric material of the ferroelectric memory cell from a first state to a second state that is different than a bias voltage applied across the electrodes to switch the polarization from the second state to the first state. In other words, applying an asymmetric biasing scheme includes applying a positive switching voltage that is different in magnitude than a negative switching voltage. For example, a direction of a polarization of the ferroelectric memory cell may be switched from a first direction to a second direction by applying a positive bias voltage across the ferroelectric memory cell that is different from a negative bias voltage to switch the direction of polarization from the second direction to the first direction. Thus, the ferroelectric memory cell may be switched from a first polarization to a second polarization at a positive bias voltage with a different absolute value than a negative bias voltage to switch from the second polarization state to the first polarization state. Operating the ferroelectric memory cell with the asymmetric biasing scheme may reduce the power used to operate the ferroelectric memory cell and may increase the effective operating life of the ferroelectric memory cell. Operating the ferroelectric memory cell with the asymmetric biasing scheme may also provide a more consistent switching signal strength over the lifetime of the ferroelectric memory cell at different operating conditions, such as at different frequency pulses.

Figure 2:
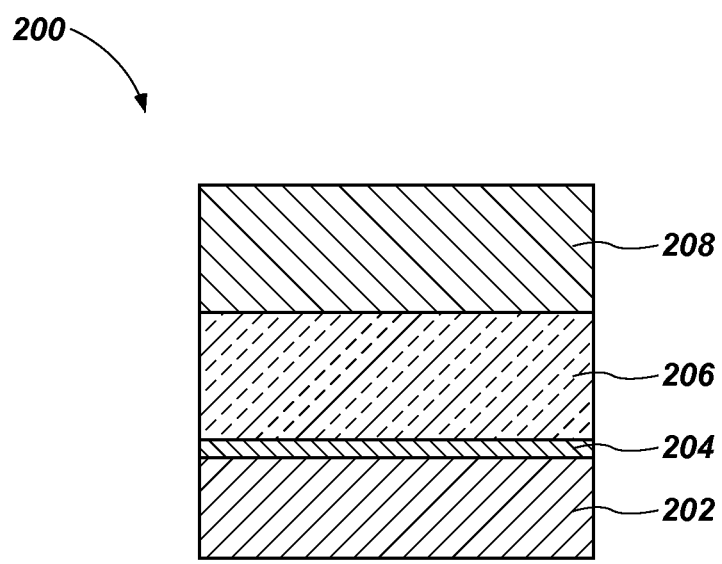
FIG. 2 is a cross-sectional view of an asymmetric ferroelectric capacitor, in accordance with an embodiment of the present disclosure.

FIG. 2 illustrates a capacitor 200 including a ferroelectric material 206. The capacitor 200 may form a part of a ferroelectric memory cell according to embodiments of the disclosure and may include a bottom electrode 202, an interfacial material 204 overlying the bottom electrode 202, a ferroelectric material 206 overlying the interfacial material 204, and a top electrode 208 overlying the ferroelectric material. The capacitor 200 may be, for example, a metal-insulator-metal (MIM) capacitor. While the capacitor 200 is described and illustrated as being used in ferroelectric memory cells, the capacitor 200 may also be used in dynamic random-access memory (DRAM) applications.

The bottom electrode 202 may include a conductive material. In some embodiments, the bottom electrode 202 includes titanium, titanium nitride (TiN), titanium aluminum nitride (TiAlN), tantalum nitride (TaN), platinum, combinations thereof, or other conductive materials. In some embodiments, the bottom electrode 202 may be doped with carbon. The bottom electrode 202 may be formed by sputtering, atomic layer deposition (ALD), chemical vapor deposition (CVD), physical vapor deposition (PVD), plasma enhanced chemical vapor deposition (PECVD), low pressure chemical vapor deposition (LPCVD), or other suitable process.

The interfacial material 204 may directly overlie and contact the bottom electrode 202 and may intervene between the bottom electrode 202 and the ferroelectric material 206. In some embodiments, the interfacial material 204 includes an oxide of the material of the bottom electrode 202. For example, where the bottom electrode 202 comprises titanium nitride, the interfacial material 204 may include titanium oxide ($TiO_x$), such as titanium dioxide ($TiO_2$). In other embodiments, the interfacial material 204 may include a non-conductive dielectric material, such as, for example, aluminum nitride (AlN). As will be described herein, the capacitor 200 including the interfacial material 204 may form an asymmetric capacitor 200 exhibiting an asymmetric hysteresis loop.

The ferroelectric material 206 may directly overlie and contact the interfacial material 204. The ferroelectric material 206 may include a dielectric material that exhibits a polarization (e.g., a displacement of oppositely charged ions to create a dipole moment) that is switchable by an external electric field. Thus, the ferroelectric material 206 may include a material capable of exhibiting a switchable polarization responsive to exposure to a switching voltage. In addition, the ferroelectric material 206 may include a remnant polarization ($P_r$) that may remain after removing the external field. As a result, the polarization of the ferroelectric material 206 may be interpreted as the state (e.g., a 1 or a 0) of the associated memory cell. The ferroelectric material 206 may include one or more of hafnium oxide ($HfO_x$), zirconium oxide ($ZrO_x$), lead zirconate titanate (PZT), another ferroelectric material known in the art, or combinations thereof. In some embodiments, the ferroelectric material 206 includes hafnium dioxide ($HfO_2$) or zirconium dioxide ($ZrO_2$).

The ferroelectric material 206 may include one or more dopants. For example, the ferroelectric material 206 may include one or more of silicon, aluminum, zirconium, magnesium, strontium, gadolinium, yttrium, other rare earth elements, and combinations thereof.

The top electrode 208 may directly overlie and contact the ferroelectric material 206. The top electrode 208 may include a conductive material. In some embodiments, the top electrode 208 includes titanium, titanium nitride, titanium aluminum nitride, tantalum nitride, platinum, combinations thereof, or other conductive materials. The top electrode 208 may be formed by sputtering, atomic layer deposition, chemical vapor deposition, physical vapor deposition, plasma enhanced chemical vapor deposition, low pressure chemical vapor deposition, or other suitable process.

In some embodiments, the top electrode 208 includes a material that is different than the bottom electrode 202. In other embodiments, the top electrode 208 may have a different thickness than the bottom electrode 202. In yet other embodiments, the top electrode 208 may be formed by a different method (e.g., ALD) than the bottom electrode 202. A top electrode 208 that includes a material different than the bottom electrode 202, has a thickness that is different than a thickness of the bottom electrode 202, is formed by a different method than the bottom electrode 202, or combinations thereof, may form an asymmetric capacitor 200.

In some embodiments, the capacitor 200 comprises a bottom electrode 202 including titanium aluminum nitride, an interfacial material 204 including aluminum nitride, a ferroelectric material 206 including one or more of hafnium oxide and zirconium oxide, and a top electrode 208 including titanium nitride. In other embodiments, the capacitor 200 comprises a bottom electrode 202 including titanium nitride, an interfacial material 204 including titanium oxide, a ferroelectric material 206 including one or more of hafnium oxide and zirconium oxide, and a top electrode 208 including titanium nitride.

Although FIG. 2 illustrates the interfacial material 204 as being disposed directly between the bottom electrode 202 and the ferroelectric material 206, the interfacial material 204 may be between the ferroelectric material 206 and the top electrode 208. In some such embodiments, the ferroelectric material 206 may directly overlie and contact the bottom electrode 202. In some embodiments, the capacitor 200 includes only one interfacial material 204 disposed between either the bottom electrode 202 and the ferroelectric material 206 or between the ferroelectric material 206 and the top electrode 208 (i.e., the interfacial material 204 may be located on only one side of the ferroelectric material 206). It is contemplated that, in other embodiments, the capacitor 200 may include an interfacial material 204 between the bottom electrode 202 and the ferroelectric material 206 and another interfacial material 204 between the top electrode 208 and the ferroelectric material 206. In some such embodiments, the interfacial material 204 between the top electrode 208 and the ferroelectric material 206 may be formed of a different material or may have a different thickness than the interfacial material 204 between the bottom electrode 202 and the ferroelectric material 206.

Figure 3:
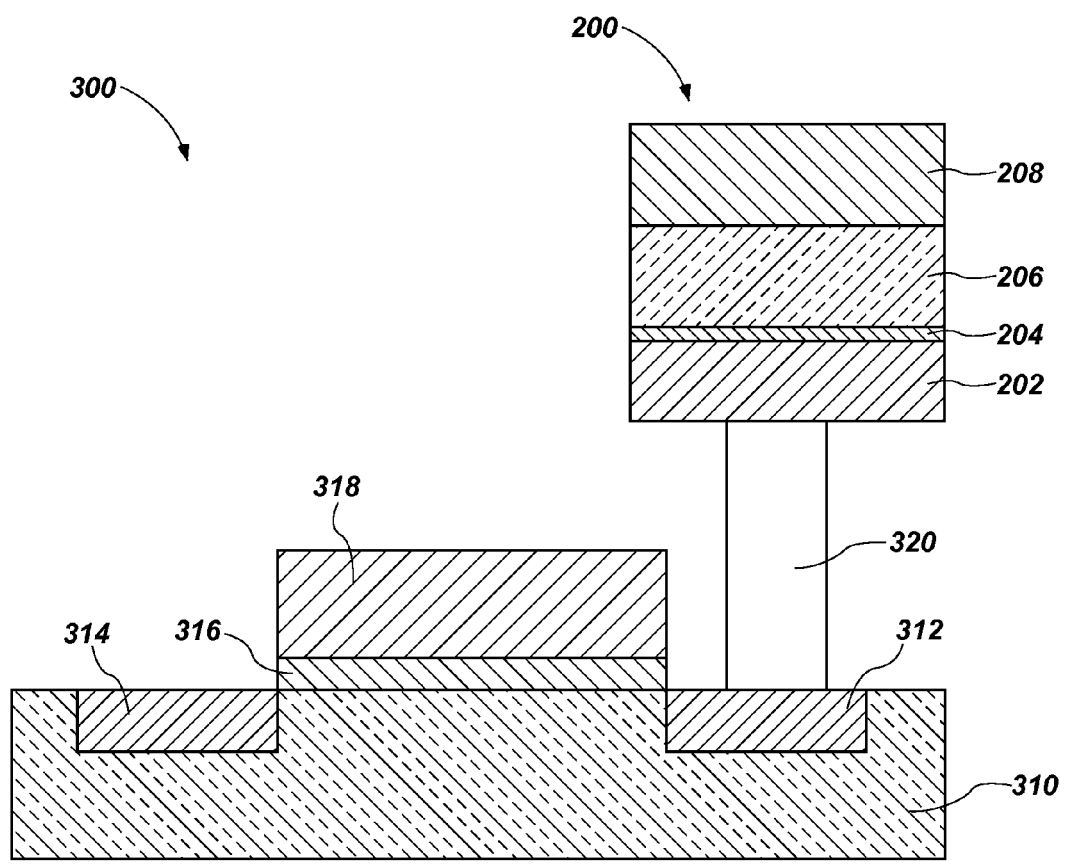
FIG. 3 is a cross-sectional view of a ferroelectric memory cell including the asymmetric ferroelectric capacitor of FIG. 2, in accordance with an embodiment of the present disclosure.

Referring to FIG. 3, a ferroelectric memory cell 300 including the capacitor 200 is shown. The ferroelectric memory cell 300 includes a substrate 310 and a source region 314 and a drain region 312 formed within the substrate 310. The substrate 310 may be a semiconductor substrate, a base semiconductor material on a supporting substrate, a metal electrode, or a semiconductor substrate having one or more materials, structures, or regions formed thereon. The substrate 310 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation.

The ferroelectric memory cell 300 may include an access transistor including a dielectric material 316 and a gate electrode 318. The capacitor 200 may be connected to the drain region 312 of the transistor via a conductive contact (e.g., a conductive plug) 320. The conductive contact 320 may overlie the drain region 312 and may directly contact the bottom electrode 202 of the capacitor 200. The conductive contact 320 may include a conductive material, such as, for example, tungsten, titanium, aluminum, copper, polysilicon, or other suitable conductive material.

The gate dielectric material 316 may include a suitable dielectric material. In some embodiments, the gate dielectric material 316 includes silicon dioxide, or a high-k dielectric material such as zirconium oxide, hafnium oxide, aluminum oxide ($Al_2O_3$), yttrium oxide ($Y_2O_3$), or other high-k dielectrics known in the art. The source region 314 and the drain region 312 may be located on opposing sides of the gate dielectric material 316.

The gate electrode 318 may include a conductive material, such as, for example, titanium, tantalum, tungsten, ruthenium, nitrides thereof, polysilicon, or other suitable conductive gate electrode material.

Accordingly, in one embodiment a ferroelectric memory cell comprises a capacitor overlying a conductive material in contact with at least one of a source region and a drain region of a semiconductor substrate, the capacitor comprising a first electrode comprising titanium aluminum nitride, a ferroelectric material comprising hafnium oxide, zirconium oxide, or a combination thereof, an interfacial material between the first electrode and the ferroelectric material, and a second electrode comprising titanium nitride over the ferroelectric material.

During use and operation, a bias (e.g., the positive switching voltage or the negative switching voltage) may be applied to the ferroelectric memory cell 300 including the ferroelectric material 206 to switch the polarization of the ferroelectric material between a first state and a second state. For example, a potential may be applied between the top electrode 208 and the bottom electrode 202 to create a potential across the capacitor 200. In some embodiments, the top electrode 208 may be exposed to a positive or negative voltage while the bottom electrode 202 is exposed to a zero voltage. In other embodiments, a first voltage may be applied to the top electrode 208 and a second voltage may be applied to the bottom electrode 202 such that a difference between the first voltage and the second voltage is equal to one of the positive switching voltage or the negative switching voltage.

Figure 4:
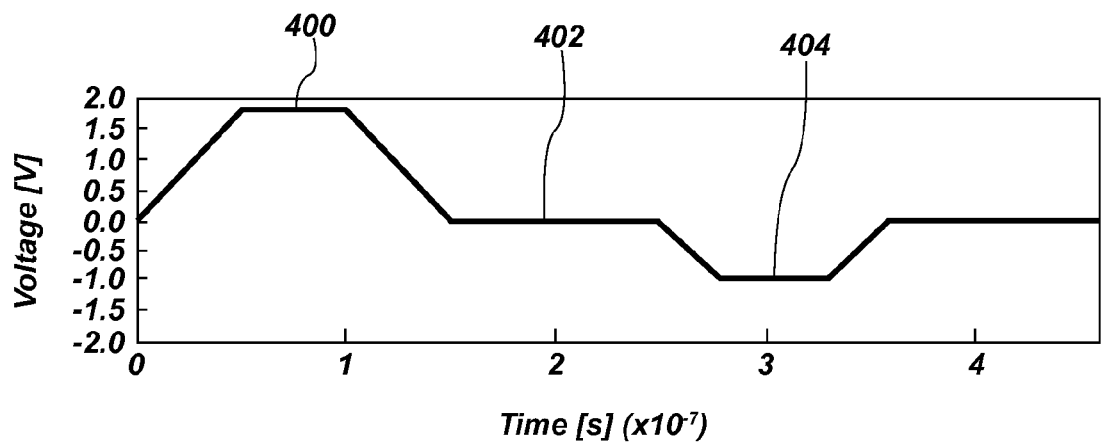
FIG. 4 is a graphical representation of an asymmetric biasing scheme for operation of a ferroelectric memory cell, in accordance with an embodiment of the present disclosure.

Referring to FIG. 4, an asymmetric biasing scheme for transitioning the polarization of the ferroelectric memory cell 300 is shown. A first bias voltage (e.g., the positive switching voltage), such as, for example, about 1.8V, shown at 400, may be applied to the ferroelectric memory cell 300. Responsive to the first bias voltage, the ferroelectric material 206 of the capacitor 200 may become polarized in a first direction. After a period of time, the first bias voltage 400 may be removed (e.g., the ferroelectric memory cell may be exposed to a zero bias), as shown at 402. Responsive to removing the first bias voltage 400, the ferroelectric material 206 may return to a remnant polarization that may correspond to a logic state of the ferroelectric memory cell 300. To switch the polarization of the ferroelectric material 206, a second bias voltage (e.g., the negative switching voltage) 404, such as, for example, about −1.0V, may be applied to the ferroelectric material 206. Thus, an absolute value of the negative switching voltage is different than an absolute value of the positive switching voltage. Responsive to exposure to the second bias voltage 404, the ferroelectric material 206 may be polarized in a second direction, opposite to the first direction. After exposing the ferroelectric material 206 to the second bias voltage 404, the second bias voltage 404 may be removed and the ferroelectric material 206 may return to a remnant polarization that may correspond to another logic state of the ferroelectric memory cell 300.

Although FIG. 4 illustrates a positive bias voltage of about 1.8V and a negative bias voltage of about −1.0V, any asymmetric biasing scheme in which an absolute value of the positive bias voltage is different from an absolute value of the negative bias voltage may be used. In some embodiments, the absolute value of one of the positive bias voltage and the negative bias voltage may be equal to between about twenty-five percent and about ninety-nine percent, such as between about twenty-five percent and about forty percent, between about forty percent and about fifty percent, between about fifty percent and about sixty percent, between about sixty percent and about seventy-five percent, between about seventy-five percent and about ninety percent, or between about ninety percent and about ninety nine percent of an absolute value of the other of the positive bias voltage and the negative bias voltage. In some embodiments, an absolute value of one of the positive bias voltage and the negative bias voltage may be less than about two-thirds, such as between about two-thirds and about one-half an absolute value of the other of the positive bias voltage and the negative bias voltage.

The first bias voltage 400 and the second bias voltage 404 may be applied by, for example, applying a potential across the capacitor 200. For example, a first potential (e.g., the positive switching voltage) may be applied between the bottom electrode 202 and the top electrode 208 to create a potential across the capacitor 200 and induce a polarization of the ferroelectric material 206 within the capacitor 200. To induce an opposite polarization of the ferroelectric material 206, the second bias voltage 404 may be applied to the ferroelectric material 206 by, for example, applying a second potential (e.g., the negative switching voltage) between the bottom electrode 202 and the top electrode 208.

Although FIG. 4 illustrates the use of one form of an asymmetric biasing scheme to induce a transition from one polarization to another polarization, it is contemplated that the polarization may be switched with other waveforms, such as, for example, a square pulse or a triangular pulse.

A ferroelectric memory cell including an asymmetric capacitor 200 (FIG. 2) having a bottom electrode 202 including titanium nitride, an interfacial material 204 including titanium oxide, a ferroelectric material 206 including one of zirconium oxide, hafnium oxide, and combinations thereof, and a top electrode 208 including titanium nitride was formed. The bottom electrode 202 had a thickness of about 100 Å, the interfacial material 204 had a thickness of about 5 Å, the ferroelectric material 206 had a thickness of about 70 Å, and the top electrode 208 had a thickness of about 50 Å. Performance for such a ferroelectric memory cell was determined by conventional techniques as illustrated in FIG. 5A through FIG. 5E.

Figure 5A:
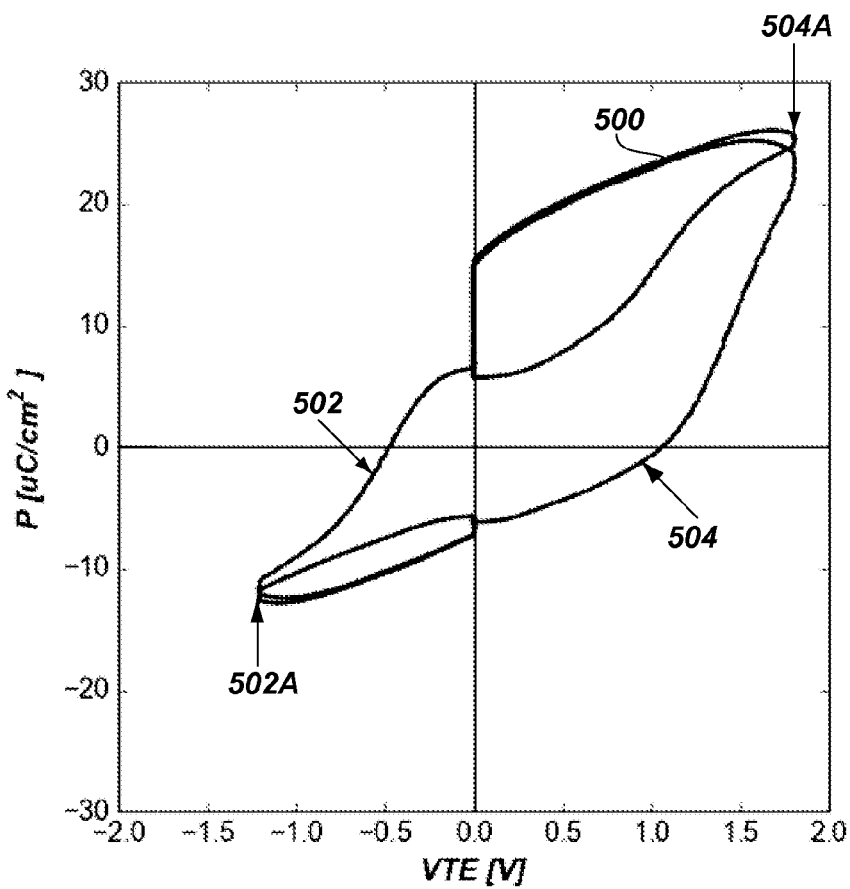
FIG. 5A is a hysteresis curve during use and operation of a ferroelectric memory cell in accordance with an embodiment of the present disclosure.

FIG. 5A illustrates a hysteresis curve 500 for such a ferroelectric memory cell to which the asymmetric biasing scheme is applied. The asymmetric biasing scheme may include applying a negative switching voltage of about −1.2V to the ferroelectric memory cell, as indicated at arrow 502A. Arrow 502 indicates that a polarization of the ferroelectric material 206 may switch from a positive polarization to a negative polarization at a negative coercive voltage of about −0.7V, located at an inflection point of the hysteresis curve. When the ferroelectric material 206 is exposed to the negative coercive voltage of approximately −0.7V (e.g., during application of the negative switching voltage), the ferroelectric material 206 may begin to switch from a positive polarization to a negative polarization. After the negative switching voltage is removed, the polarization of the ferroelectric material 206 may return to a negative remnant polarization (e.g., $-P_r$) of about 7 $\mu C/cm^2$.

The asymmetric biasing scheme may include applying a positive switching voltage of about 1.8V to the ferroelectric memory cell, as indicated at arrow 504A. Arrow 504 indicates that a polarization of the ferroelectric material 206 may switch from a negative polarization to a positive polarization at a positive coercive voltage of about 1.1V. When the ferroelectric material 206 is exposed to the positive coercive voltage of approximately 1.1V (e.g., during application of the positive switching voltage), the ferroelectric material 206 may begin to switch from a negative polarization to a positive polarization. After the positive switching voltage is removed, the polarization of the ferroelectric material 206 may return to a positive remnant polarization (e.g., $P_r$) of about 5 $\mu C/cm^2$. Accordingly, the ferroelectric material 206 may exhibit asymmetric switching properties. In other words, an absolute value of the switching voltage used to switch the polarization of the ferroelectric material 206 from a first polarization to a second polarization is not equal to an absolute value of the switching voltage used to switch the polarization of the ferroelectric material 206 from the second polarization to the first polarization. For example, the ferroelectric material 206 may be switched from a negative polarization to a positive polarization by applying a positive switching voltage of approximately 1.8V to the ferroelectric material 206 while the ferroelectric material 206 may be switched from the positive polarization to the negative polarization by applying a negative switching voltage of approximately −1.2V.

Figure 5B:
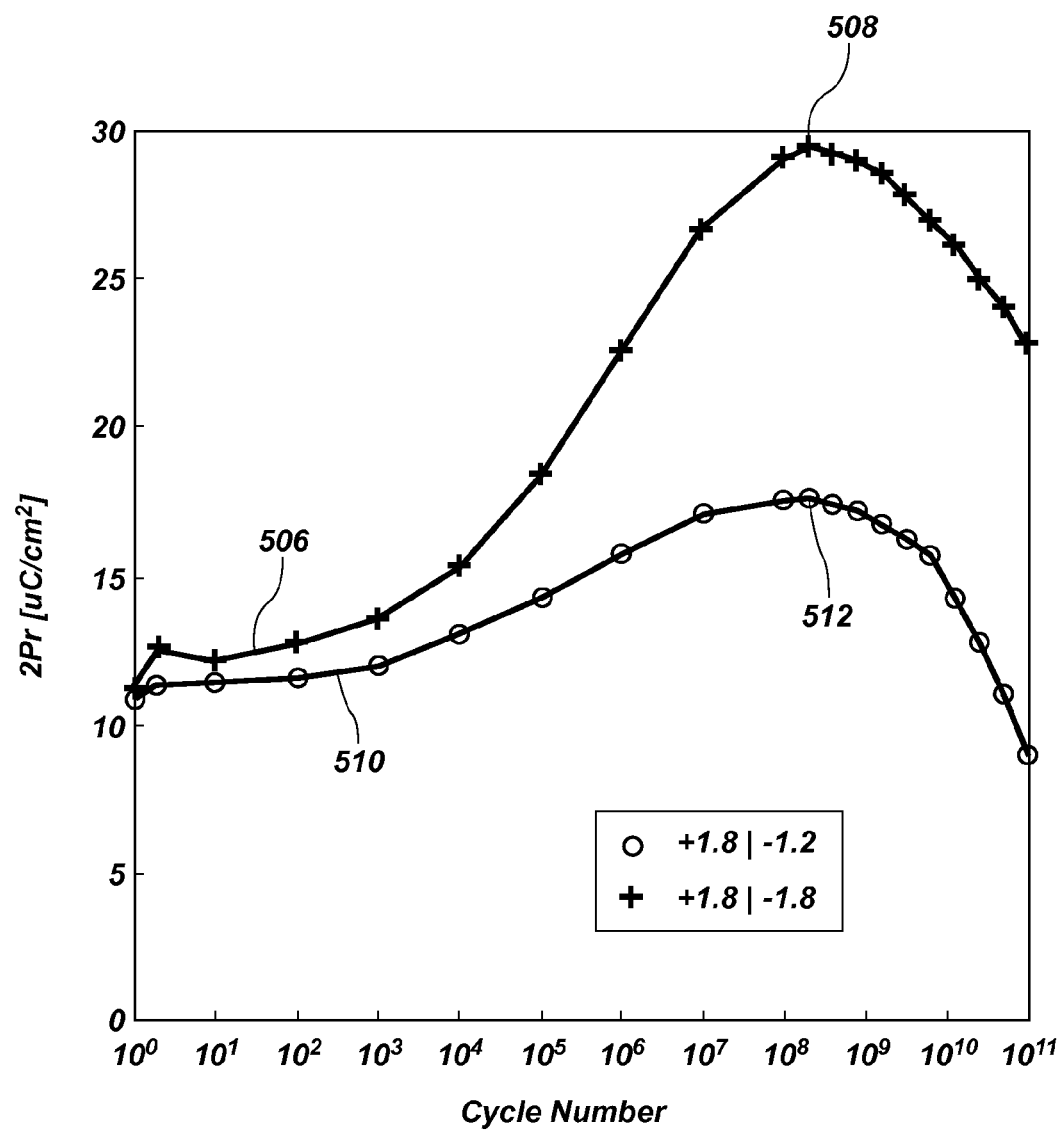
FIG. 5B is a graph of a signal strength vs. cycle number of a ferroelectric memory cell operated with a symmetric biasing scheme compared to the ferroelectric memory cell operated with an asymmetric biasing scheme in accordance with an embodiment of the present disclosure.

Referring to FIG. 5B, a graph illustrating a difference between a positive remnant polarization and a negative polarization of a ferroelectric memory cell including the ferroelectric material 206 over several cycles of the ferroelectric memory cell is shown. The x-axis plots the cycle number and the y-axis plots the value of $2P_r$, which is equal to a polarization difference between the positive polarization state and the negative polarization state of the ferroelectric material 206. The value of $2P_r$ may be equal to a difference between the positive remnant polarization and the negative remnant polarization, which, in some embodiments, may correspond to a polarization strength of the ferroelectric memory cell including the ferroelectric material. Over the lifetime of a ferroelectric memory cell, it is desirable for the value of $2P_r$ to remain constant so that a constant polarization signal may be sensed for reading the logic state of the ferroelectric memory cell.

With continued reference to FIG. 5B, the upper curve illustrates the polarization strength over the operating life of the ferroelectric memory cell while applying a symmetric biasing scheme (e.g., a positive switching voltage of about 1.8V and a negative switching voltage of about −1.8V). The lower curve illustrates a polarization strength over the operating life of the same ferroelectric memory cell while applying an asymmetric biasing scheme (e.g., a positive switching voltage of about 1.8V and a negative switching voltage of about −1.2V). During initial stages of operation, and up to about $10^4$ cycles, the polarization strength with the symmetric biasing scheme and the polarization strength with the asymmetric biasing scheme are substantially flat (e.g., the memory cell exhibits a substantially constant polarization strength), as illustrated at 506 and 510, respectively. However, when operated with the symmetric biasing scheme, the ferroelectric memory cell exhibits an undesirable increased signal peaking as the number of cycles of the ferroelectric increases, as illustrated at 508. On the other hand, when operated with the asymmetric biasing scheme, the ferroelectric memory cell exhibits reduced signal peaking as the number of cycles of the ferroelectric cell increases, as illustrated at 512. Thus, the ferroelectric memory cell may exhibit reduced signal peaking and less variation in signal strength over the course of operation of the ferroelectric memory cell when operated with the asymmetric biasing scheme than with the symmetric biasing scheme. Even though the maximum signal strength is reduced under the asymmetric biasing scheme, a more constant polarization strength may be preferred for sensing the operational state of the ferroelectric memory cell.

It is contemplated that one of the positive bias voltage and the negative bias voltage may be altered during the operating life of the ferroelectric memory cell such that the polarization strength is maintained at a substantially constant strength. In some embodiments, after a predetermined number of cycles, at least one of the positive bias voltage and the negative bias voltage may be adjusted to maintain a substantially flat polarization strength.

Figure 5C:
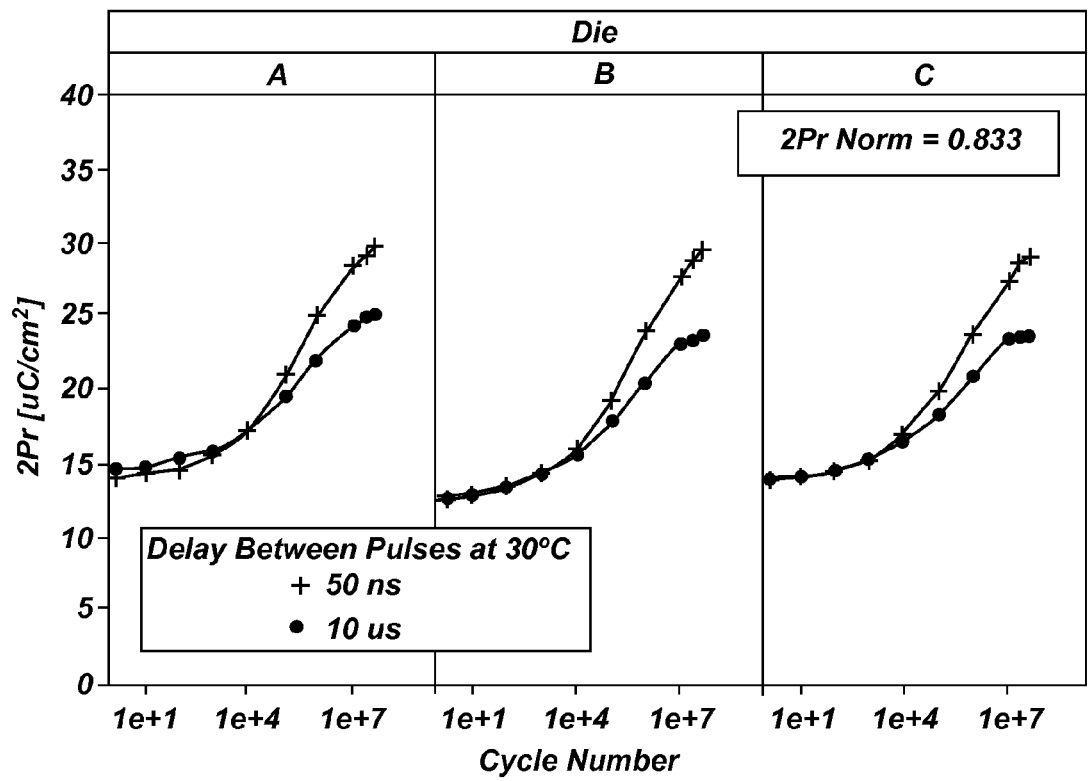
FIG. 5C is a graphical representation of frequency-dependent signal loss during cycling of a ferroelectric memory cell when the cell is operated with a symmetric biasing scheme and an asymmetric biasing scheme at 30° C.
Figure 5C:
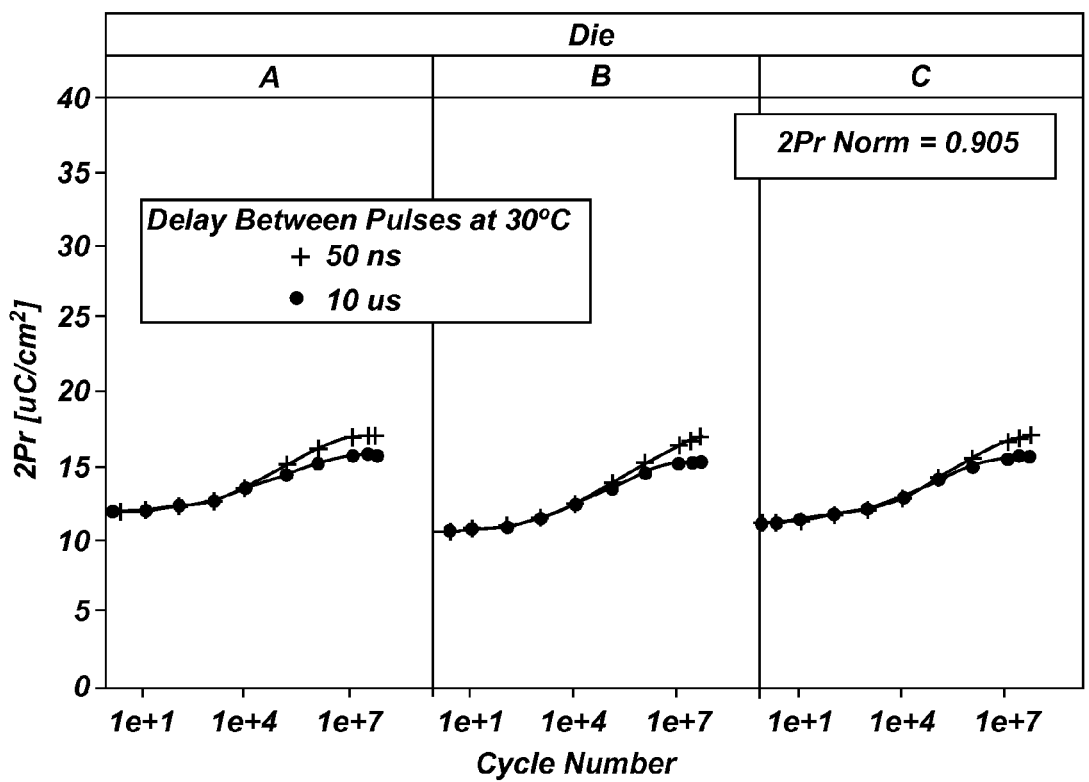

Referring to FIG. 5C, the frequency dependence of the ferroelectric memory cell as a function of cycle number is shown. The top graph of FIG. 5C illustrates the read signal of the ferroelectric memory cell as a function of cycle number for cell pulses of different frequencies (e.g., delays of about 50 ns and delays of about 10 μs between pulses) for three different ferroelectric memory cells (labeled as "A," "B," and "C") operated with the symmetric biasing scheme while the bottom graph illustrates the read signal of the ferroelectric memory cell as a function of cycle number for cell pulses of different frequencies for three different ferroelectric memory cells operated with the asymmetric biasing scheme. FIG. 5C illustrates the frequency dependence of the ferroelectric memory cells at a temperature of about 30° C. Generally, as the delay time between pulses increases, the read signal undesirably decreases. The value of $2P_r$Norm may be defined as the ratio of $2P_r$ with a long delay (e.g., 10 μs) divided by $2P_r$ with a long delay (e.g., 50 ns) after about, for example, $4 \times 10^7$ cycles. In general, it is desired that the value of $2P_r$Norm be equal to approximately 1.0, meaning that as the time between cycles is changed (i.e., the cycle frequency), the read signal of the ferroelectric memory cell does not change.

The top graph of FIG. 5C illustrates that for the symmetric biasing scheme, the value of $2P_r$Norm is equal to about 0.833. The bottom graph of FIG. 5C illustrates that for the asymmetric biasing scheme, the value of $2P_r$Norm is equal to about 0.905. In other words, for the asymmetric biasing scheme, after about $4 \times 10^7$ cycles, the ferroelectric memory cell exhibits less frequency-dependent signal loss with longer pulses than when operated with the symmetric biasing scheme. Thus, under the asymmetric biasing scheme, the ferroelectric memory cell exhibits about 43% less signal loss than when the ferroelectric memory cell is operated with the symmetric biasing scheme.

Figure 5D:
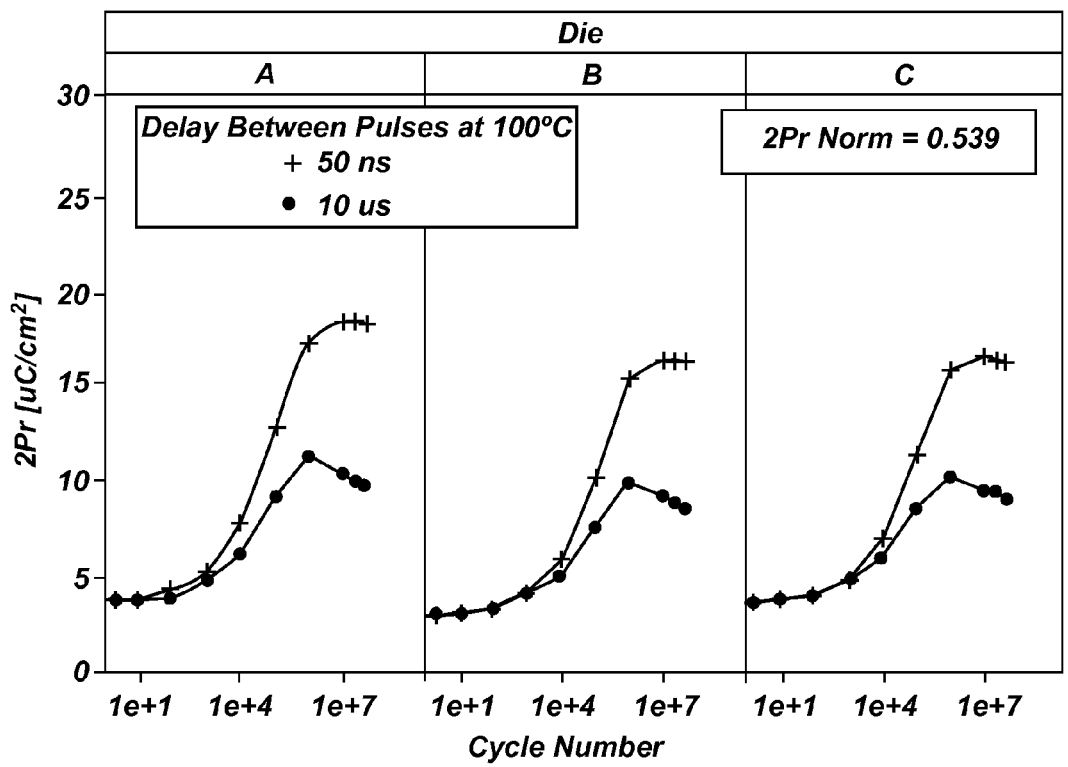
FIG. 5D is a graphical representation of frequency-dependent signal loss during cycling of a ferroelectric memory cell when the cell is operated with a symmetric biasing scheme and an asymmetric biasing scheme at 100° C.
Figure 5D:
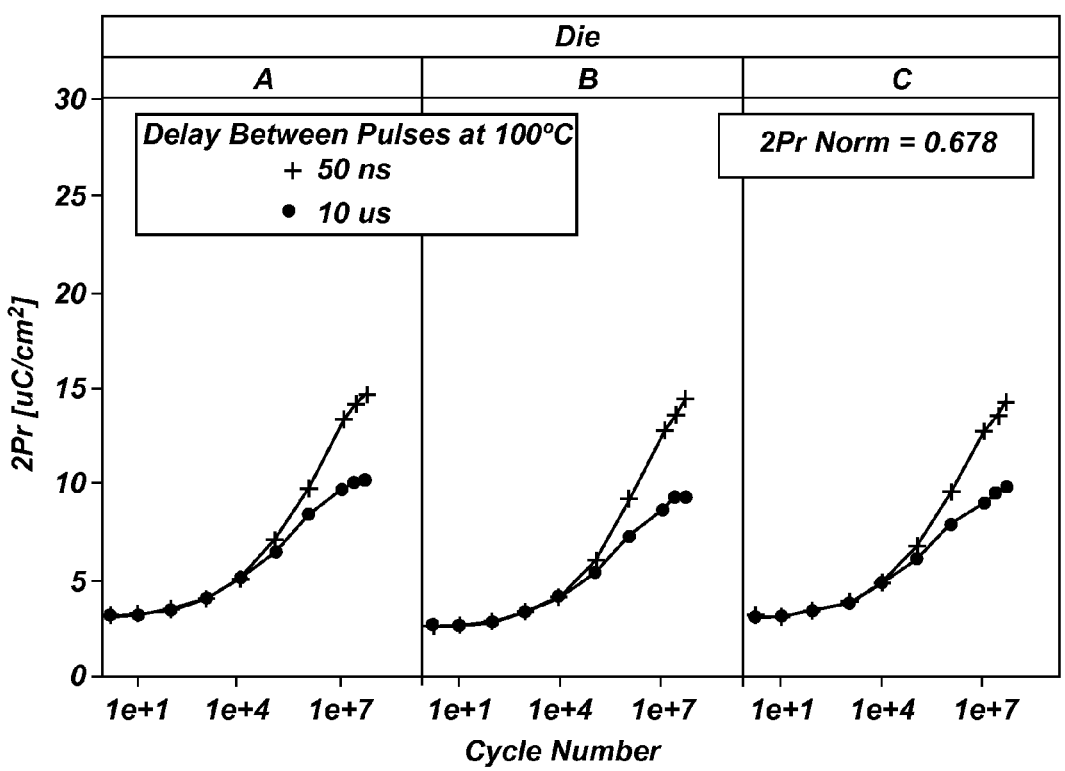

Referring to FIG. 5D, the frequency dependence of the ferroelectric memory cell as a function of cycle number is shown for a temperature of about 100° C. In general, ferroelectric memory cell performance degrades at elevated temperatures due to increased thermal depolarization of the ferroelectric material. FIG. 5D illustrates that at 100° C., the frequency dependence of the ferroelectric memory cells is improved when operated with an asymmetric biasing scheme compared to a symmetric biasing scheme. For example, the value of $2P_r$Norm for the symmetric biasing scheme is shown as about 0.539 and the value of $2P_r$Norm for the asymmetric biasing scheme is about 0.678. In some embodiments, the ferroelectric memory cell may be operated at elevated temperatures, meaning that the improved value of $2P_r$Norm may be advantageous at the elevated temperatures.

Figure 5E:
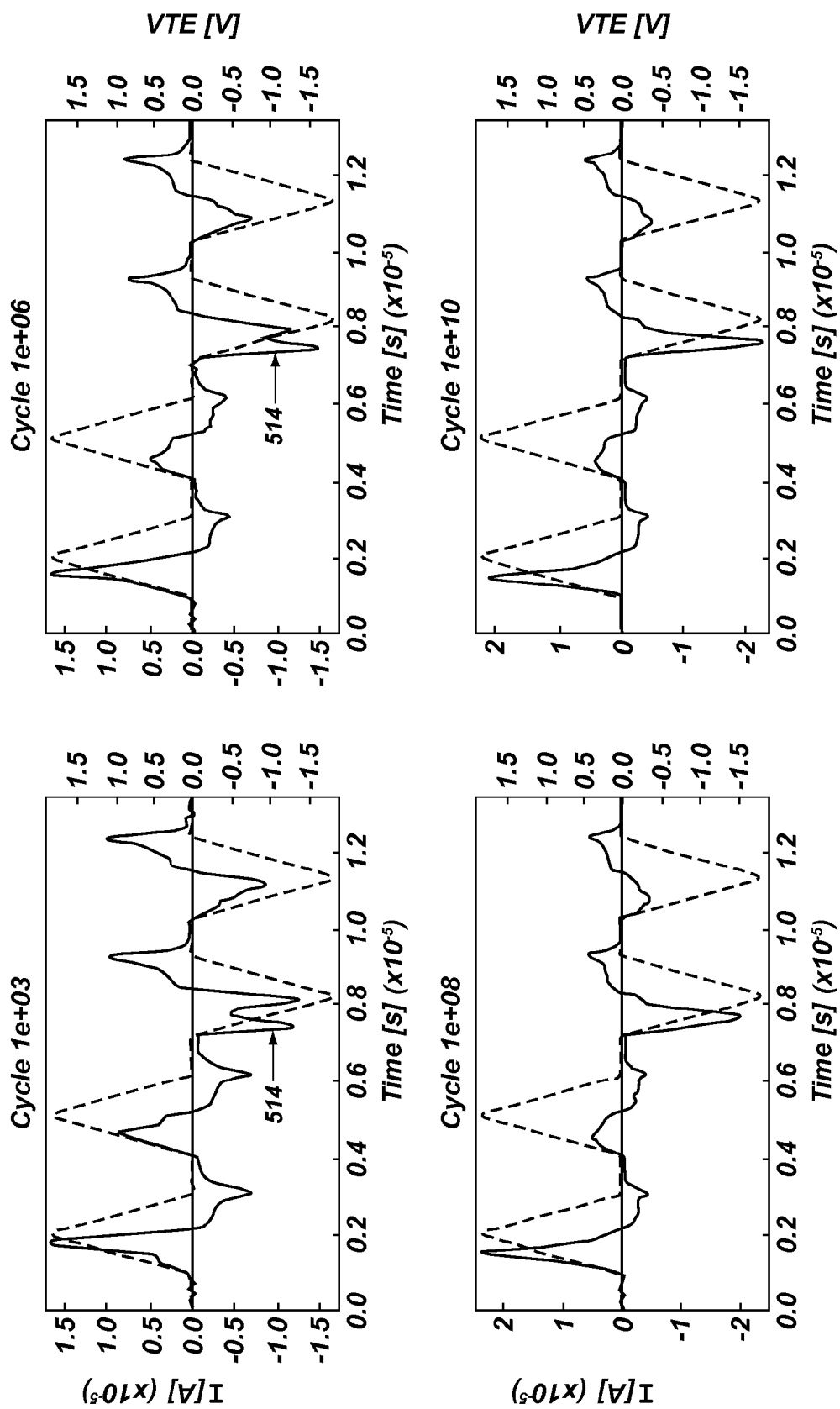
FIG. 5E and FIG. 5F are graphs illustrating the voltage and the current of ferroelectric memory cells operating with a symmetric biasing scheme and an asymmetric biasing scheme, respectively, at various cycle numbers.

Referring to FIG. 5E, graphs of voltage and current as a function of time are illustrated for the ferroelectric memory cell operated with a symmetric biasing scheme (e.g., a positive switching voltage of about 1.8V and a negative switching voltage of about −1.8V). The voltage and current of the ferroelectric memory cell are plotted after a plurality of cycle numbers, (e.g., $1 \times 10^3$ cycles, $1 \times 10^6$ cycles, $1 \times 10^8$ cycles, and $1 \times 10^{10}$ cycles). Referring to the graph at the top left, at low cycle counts (e.g., $1 \times 10^3$ cycles), the current of the ferroelectric memory cell may exhibit a double peak as indicated at 514. Referring to the graph at the top right, the double peak 514 may remain after about $1 \times 10^6$ cell cycles. The double peak 514 may undesirably cause the ferroelectric memory cell to switch or may reduce a sensing window of the ferroelectric memory cell at the low cycle counts. As an example, the ferroelectric memory cell may have a tendency to switch at each of the peaks of the double peak 514. Referring to the lower graphs of FIG. 5E, the ferroelectric memory cell may no longer exhibit the double peak 514 at the $1 \times 10^8$ and $1 \times 10^{10}$ cycles.

Figure 5F:
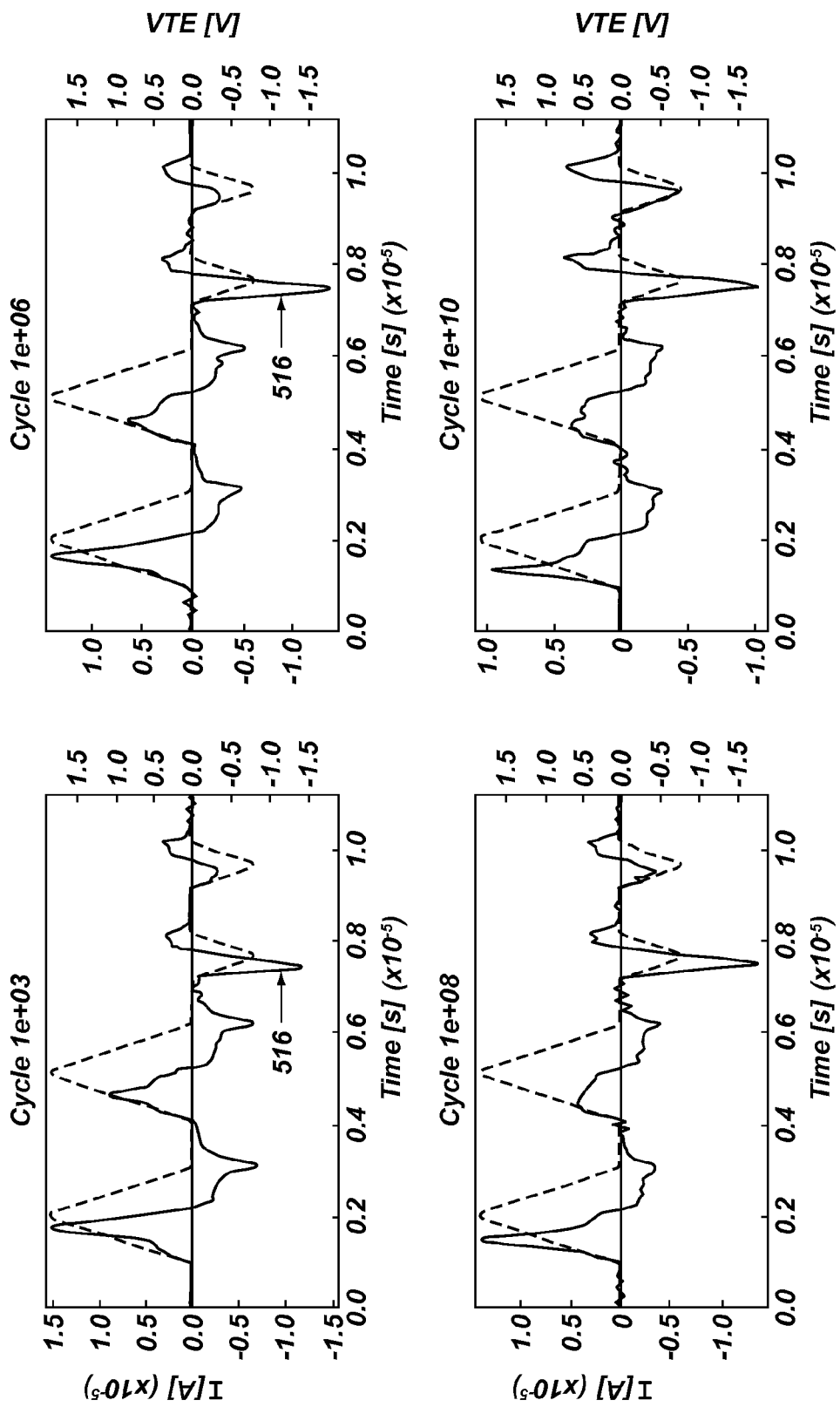

Referring to FIG. 5F, graphs of the voltage and current as a function of time are illustrated for the ferroelectric memory cell operated with an asymmetric biasing scheme. In some embodiments, the asymmetric biasing scheme may include selecting the positive switching voltage to be about 1.8V and the negative switching voltage to be about −0.8V. Referring to the different voltage and current plots, the ferroelectric memory cell does not exhibit double peaks at either low or high cycle counts. Rather, with reference to the upper graphs (e.g., at $1 \times 10^3$ and $1 \times 10^6$ cycles), only a single peak, indicated as 516, is shown for all of the measured cycle counts. Accordingly, operating the ferroelectric memory cell with the asymmetric biasing scheme may improve the operation of the ferroelectric memory cell and reduce undesired switching of the ferroelectric memory cell at low cycle counts.

A ferroelectric memory cell including an asymmetric capacitor 200 (FIG. 2) having a bottom electrode 202 including titanium aluminum nitride (TiAlN), a dielectric interfacial material 204 including aluminum nitride (AlN), a ferroelectric material 206 including one of zirconium oxide, hafnium oxide, and combinations thereof, and a top electrode 208 including titanium nitride was formed. The bottom electrode 202 had a thickness of about 60 Å, the interfacial material 204 had a thickness of about 2 Å, the ferroelectric material 206 had a thickness of about 70 Å, and the top electrode 208 had a thickness of about 50 Å. Performance of such a ferroelectric memory cell was determined by conventional techniques as illustrated in FIG. 6A through FIG. 6F.

Figure 6A:
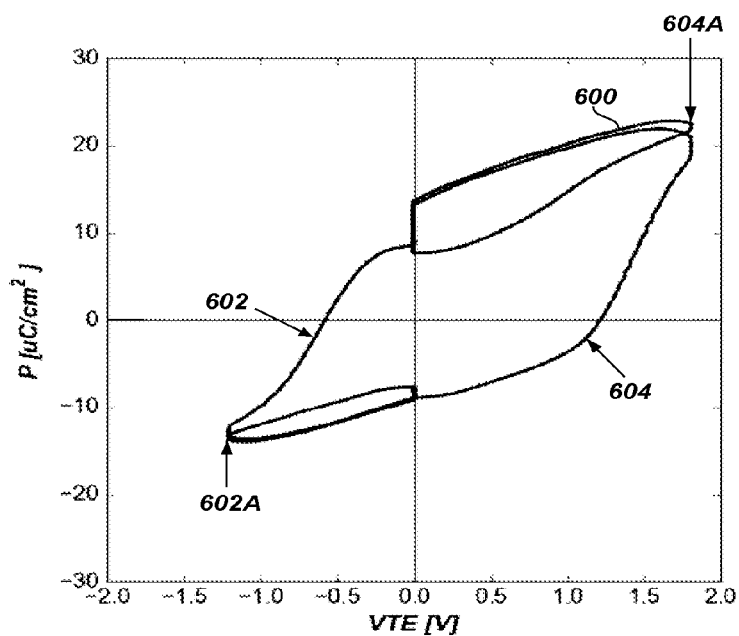
FIG. 6A is a hysteresis curve during use and operation of an asymmetric ferroelectric memory cell in accordance with an embodiment of the present disclosure.

FIG. 6A illustrates a hysteresis curve 600 for such a ferroelectric memory cell to which the asymmetric biasing scheme is applied. The asymmetric biasing scheme may include applying a negative switching voltage of about −1.2V to the ferroelectric memory cell, as indicated at arrow 602A. Arrow 602 indicates that a polarization of the ferroelectric material 206 may switch from a positive polarization to a negative polarization at a negative coercive voltage of about −0.7V, located at an inflection point of the hysteresis curve. When the ferroelectric material 206 is exposed to the negative coercive voltage of about −0.7V (e.g., during application of the negative switching voltage), the ferroelectric material 206 may begin to switch from the positive polarization to the negative polarization. After the negative switching voltage is removed, the polarization of the ferroelectric material 206 may return to a negative remnant polarization (e.g., −$P_r$) of about −10 $\mu C/cm^2$.

The asymmetric biasing scheme may include applying a positive switching voltage of about 1.8V to the ferroelectric memory cell, as indicated at arrow 604A. Arrow 604 indicates that a polarization of the ferroelectric material 206 may switch from a negative polarization to a positive polarization at a positive coercive voltage of about 1.2V. When the ferroelectric material 206 is exposed to the positive coercive voltage of approximately 1.2V (e.g., during application of the positive switching voltage), the ferroelectric material 206 may begin to switch from a negative polarization to a positive polarization. After removal of the positive switching voltage, the ferroelectric material 206 may exhibit a positive remnant polarization of about 8 $\mu C/cm^2$. Thus, in some embodiments, the positive remnant polarization and the negative remnant polarization may have different magnitudes (e.g., an absolute value of the positive remnant polarization may not be equal to an absolute value of the negative remnant polarization).

Accordingly, the ferroelectric material 206 may exhibit asymmetric switching properties. In other words, an absolute value of the switching voltage used to switch the polarization of the ferroelectric material 206 from a first polarization to a second polarization is not equal to an absolute value of the switching voltage used to switch the polarization of the ferroelectric material 206 from the second polarization to the first polarization. For example, the ferroelectric material 206 may be switched from a negative polarization to a positive polarization by applying a positive switching voltage of approximately 1.8 to the ferroelectric material 206 while the ferroelectric material 206 may be switched from the positive polarization to the negative polarization by applying a negative switching voltage of about −1.2V.

Figure 6B:
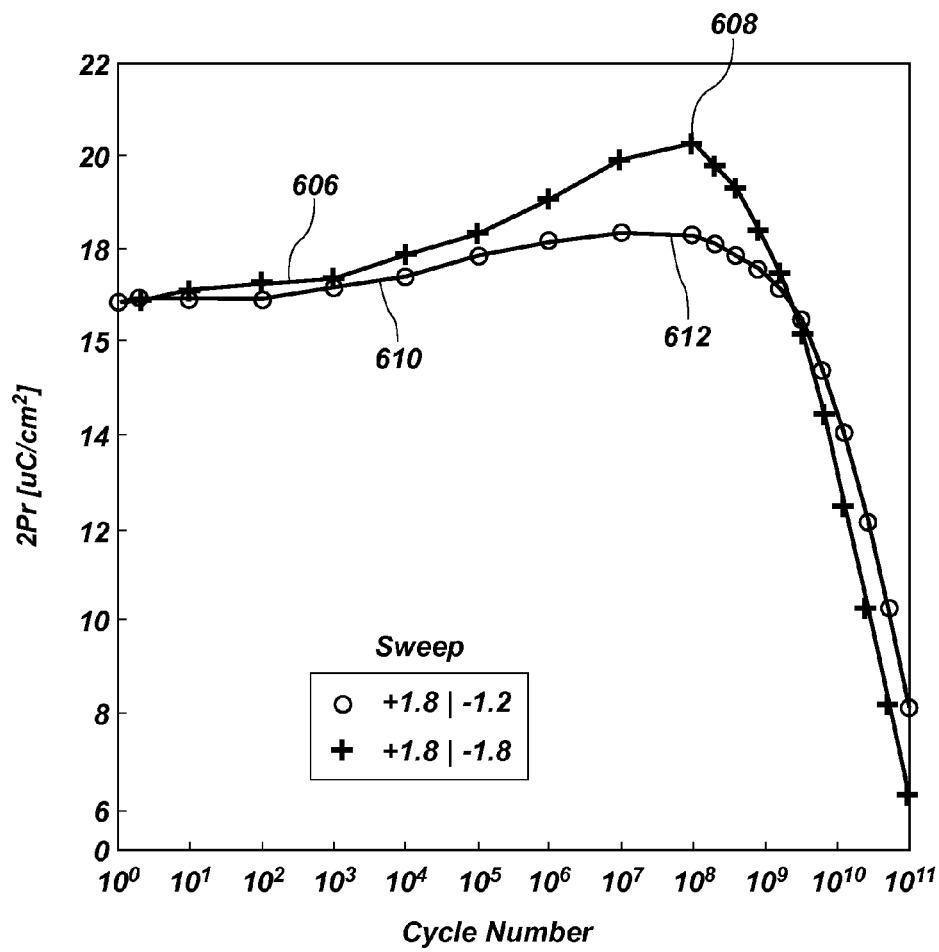
FIG. 6B is a graph of a signal strength vs. cycle number of a ferroelectric memory cell operated with a symmetric biasing scheme compared to the ferroelectric memory cell operated with an asymmetric biasing scheme in accordance with an embodiment of the present disclosure.

Referring to FIG. 6B, a graph illustrating a polarization strength of the ferroelectric memory cell of FIG. 6A over several cycles of the ferroelectric memory cell is shown. The upper curve illustrates the value of 2$P_r$ of the ferroelectric memory cell while applying a symmetric biasing scheme (e.g., a positive switching voltage of about 1.8V and a negative switching voltage of about −1.8V) and the lower curve illustrates the polarization strength of the ferroelectric memory cell while applying an asymmetric biasing scheme (e.g., a positive switching voltage of about 1.8V and a negative switching voltage of about −1.2V), as described above with reference to FIG. 5B. As illustrated at 606 and 610, the polarization strength of the ferroelectric memory cell with the symmetric biasing scheme and with the asymmetric biasing scheme are substantially flat during initial stages of operation. When operated with the symmetric biasing scheme, the polarization strength begins to increase at about $10^5$ cycles and the signal peaks at about $10^8$ cycles, as indicated at 608. When operated with the asymmetric biasing scheme, the polarization strength begins to increase at about $10^6$ cycles with the signal peaking occurring at about $10^8$ cycles, as indicated at 612. Advantageously, the peak signal at 612 is substantially the same as the polarization strength exhibited throughout the operating life of the ferroelectric memory cell. Accordingly, over the lifetime of the ferroelectric cell, the polarization strength of the ferroelectric memory cell operated with the asymmetric biasing scheme may remain substantially constant.

When operated with the symmetric biasing scheme, the ferroelectric memory cell may begin to fatigue after about $10^8$ cycles. For example, the read signal may begin to decrease after about $10^8$ cycles, and may decrease to about 6 $\mu C/cm^2$ after about $10^{11}$ cycles. When operated with the asymmetric biasing scheme, the ferroelectric memory cell may not exhibit fatigue as early as when it is operated with the symmetric biasing scheme. For example, the ferroelectric memory cell may not begin to exhibit fatigue until after about $10^9$ cycles. Thus, when operated with the asymmetric biasing scheme, the ferroelectric memory cell may exhibit a lower amount of signal peaking and may not exhibit fatigue until after more operation cycles. When the results of FIG. 6B are compared to the results of FIG. 5B, which plot the polarization strength of a ferroelectric memory cell including different materials than that in FIG. 6B, similar trends were observed.

With continued reference to FIG. 6B, the ferroelectric memory cell including the titanium aluminum nitride bottom electrode and the aluminum nitride interfacial material may exhibit less variation in the polarization strength during operating of the ferroelectric memory cell than the ferroelectric memory cell including the titanium nitride electrodes having different thicknesses.

Figure 6C:
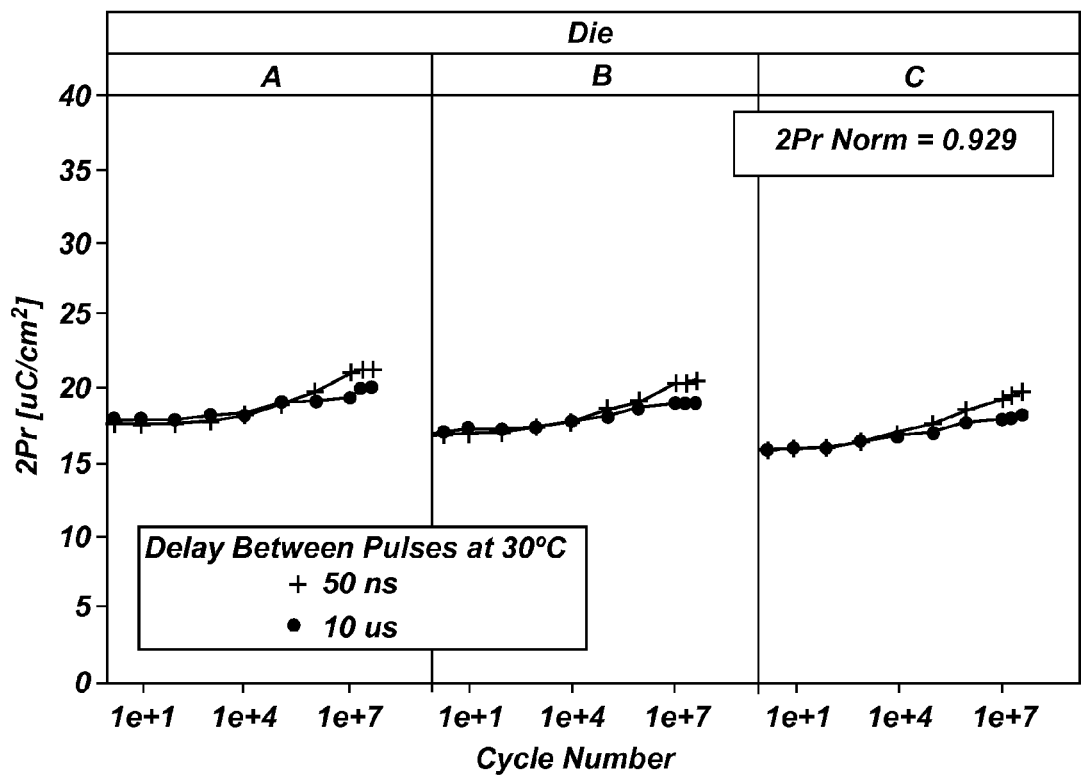
FIG. 6C is a graphical representation of frequency-dependent signal loss during cycling of a ferroelectric memory cell when the cell is operated with a symmetric biasing scheme and an asymmetric biasing scheme at 30° C.
Figure 6C:
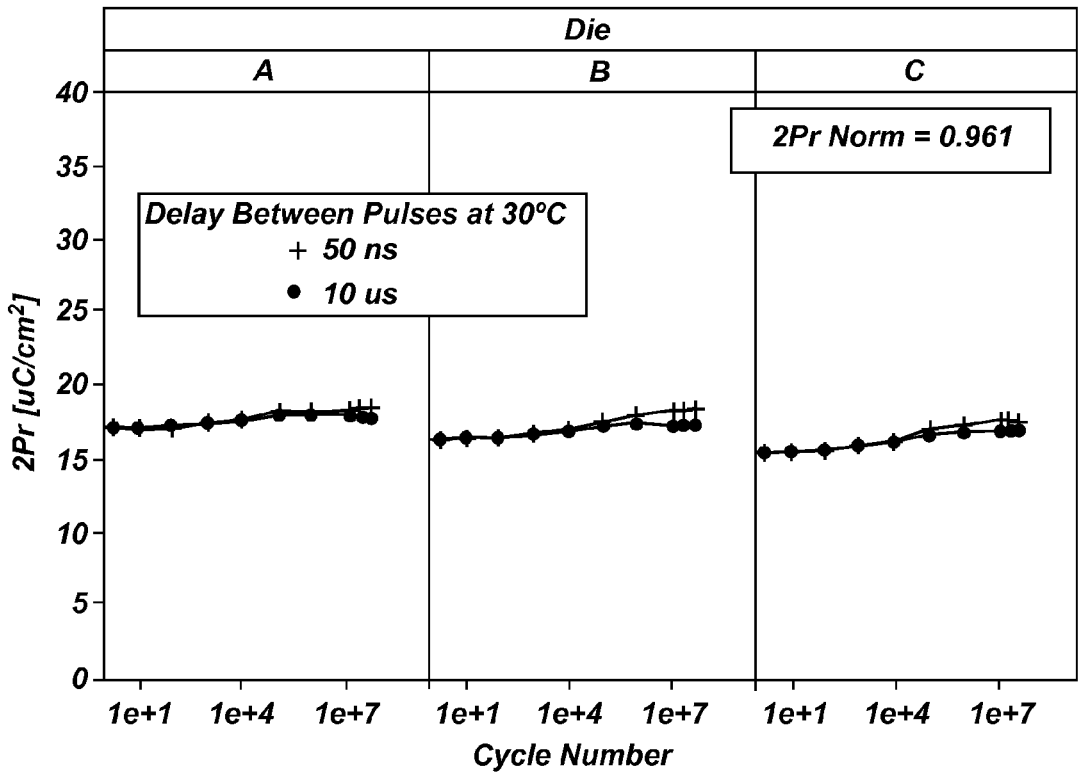

Referring to FIG. 6C, the frequency dependence of the ferroelectric memory cell as a function of cycle number at a temperature of about 30° C. is shown. The top graph of FIG. 6C illustrates that for the symmetric biasing scheme, 2$P_r$Norm is equal to about 0.929. The bottom graph illustrates that for the asymmetric biasing scheme, 2$P_r$Norm is equal to about 0.961. Thus, the ferroelectric memory cell may exhibit less frequency-dependent signal loss at longer cycle pulses when operated with the asymmetric biasing scheme than when operated with the symmetric biasing scheme.

Figure 6D:
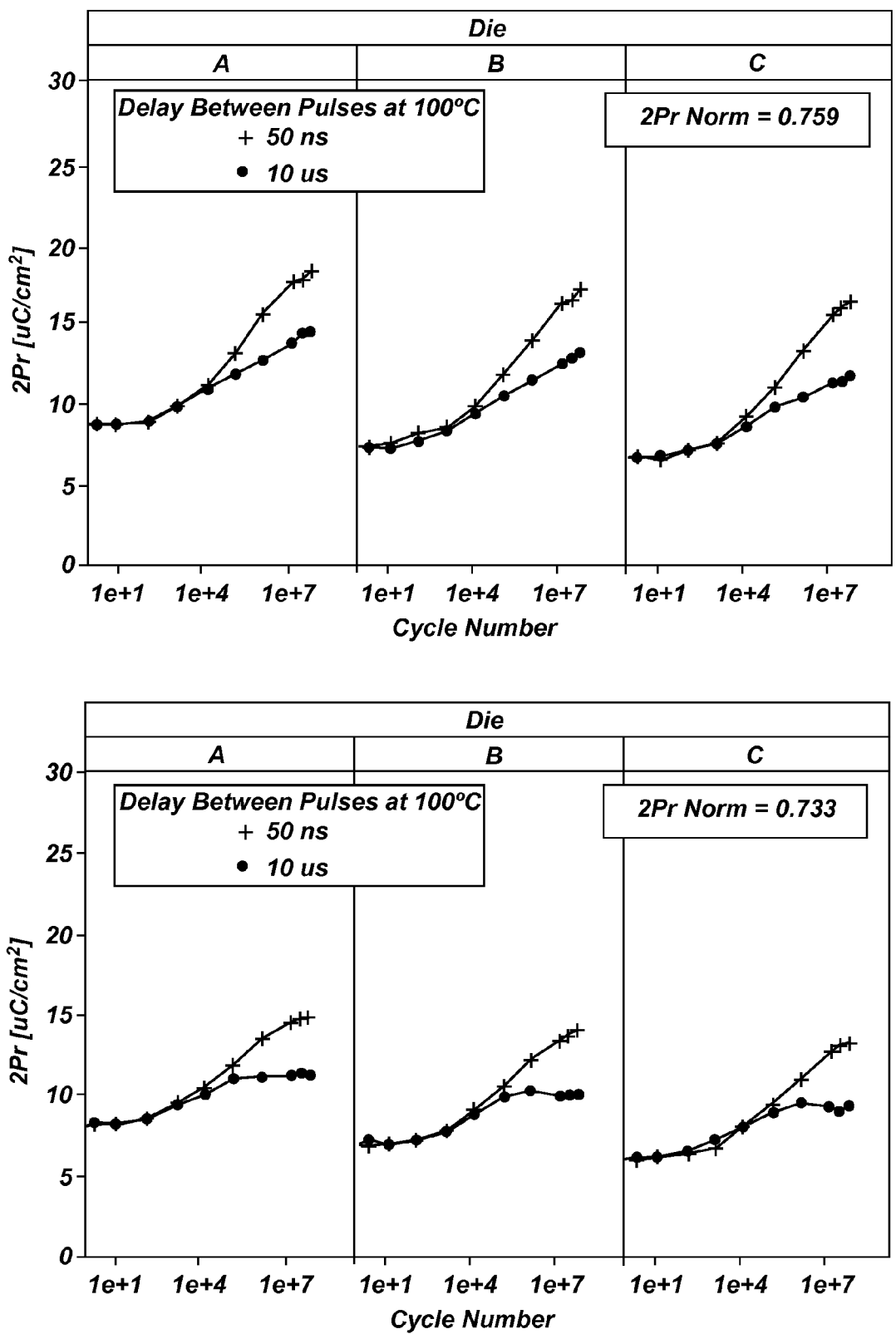
FIG. 6D is a graphical representation of frequency-dependent signal loss during cycling of a ferroelectric memory cell when the cell is operated with a symmetric biasing scheme and an asymmetric biasing scheme at 100° C.

Referring to FIG. 6D, the frequency dependence of the ferroelectric memory cell as a function of cycle number is shown for a temperature of about 100° C. The value of 2$P_r$Norm for the symmetric biasing scheme is about 0.759 and the value of 2$P_r$Norm for the asymmetric biasing scheme is about 0.733. Thus, the ferroelectric memory cell may exhibit only a slightly higher value of 2$P_r$Norm when operated with a symmetric biasing scheme compared to an asymmetric biasing scheme.

Figure 6E:
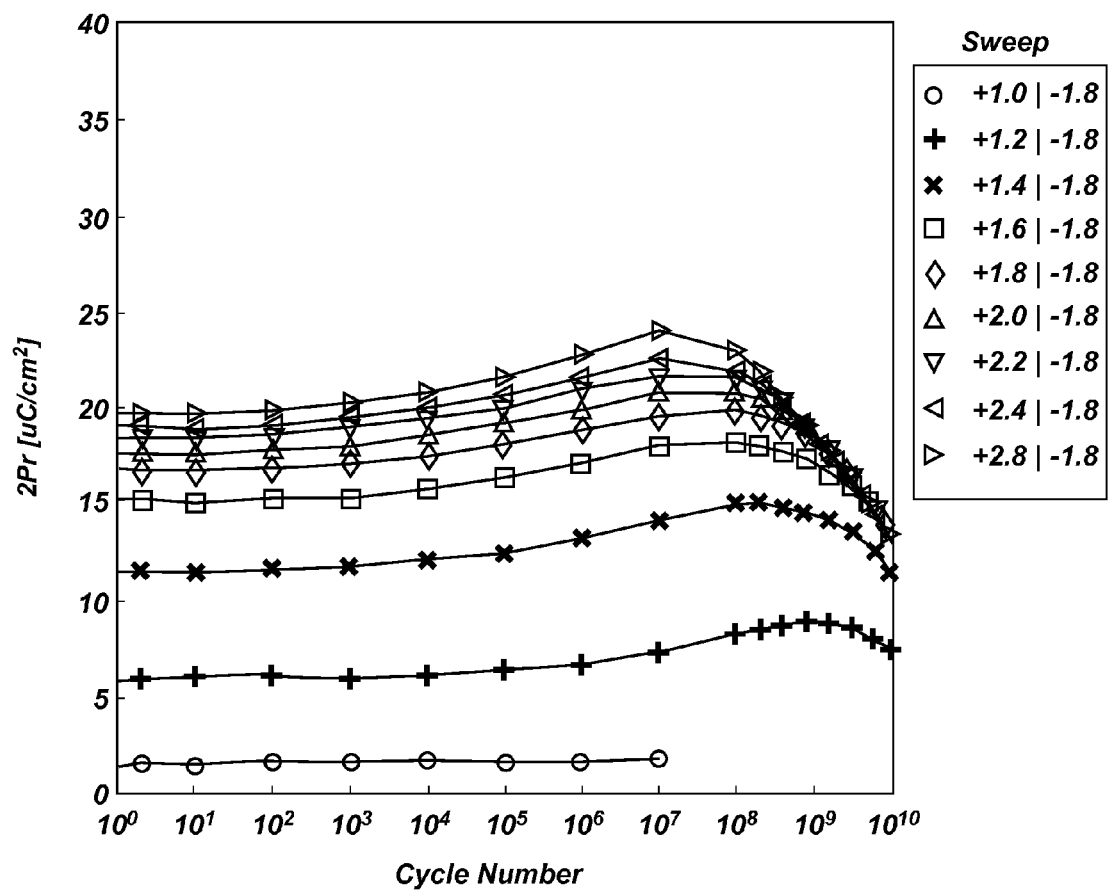
FIG. 6E is a graphical representation of signal strength as a function of cycle number for ferroelectric cells operated at a constant negative bias voltage and different positive bias voltages.

Referring to FIG. 6E, the asymmetric biasing scheme may be tailored to achieve a desired signal strength over the operating lifetime of the ferroelectric memory cell. FIG. 6E illustrates a plurality of asymmetric biasing schemes and a symmetric biasing scheme of the asymmetric ferroelectric memory cell. Each of the biasing schemes include the same negative switching voltage (i.e., −1.8V) while changing the positive switching voltage. As illustrated in FIG. 6E, the positive switching voltage may affect the initial signal level of the ferroelectric memory cell. As the positive switching voltage is increased, the signal level of the ferroelectric memory cell may also increase.

Figure 6F:
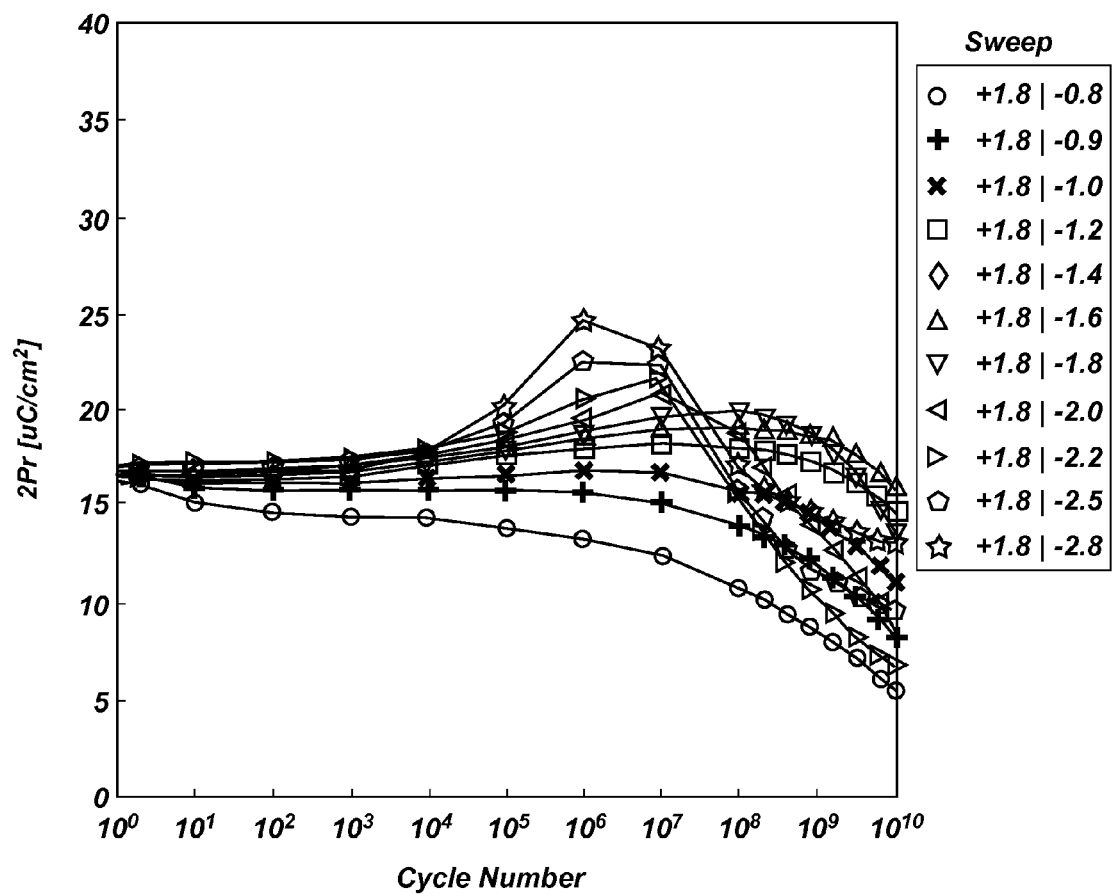
FIG. 6F is a graphical representation of signal strength as a function of cycle number for ferroelectric cells operated at a constant positive bias voltage and different negative bias voltages.

Referring to FIG. 6F, the asymmetric biasing scheme may be tailored to control the amount of signal peaking and the onset of fatigue. FIG. 6F illustrates signal strength as a function of cycle number for a number of biasing schemes having the same positive switching voltage (i.e., 1.8V) while changing the negative switching voltages. In general, when operated with negative switching voltages having a larger magnitude (e.g., −2.8V, −2.5V, −2.2V, etc.), the ferroelectric memory cell exhibited a larger amount of undesired signal peaking. However, when operated with negative switching voltages having a lower magnitude (e.g., −0.8V, −0.9V, −1.0V, etc.), the ferroelectric memory cell exhibited lower signal strengths and also begins to fatigue at lower cycle numbers. At negative switching voltages such as −1.2V, −1.4V, and −1.6V, the ferroelectric memory cell exhibited substantially flat signals and did not begin to exhibit fatigue characteristics until higher cycle numbers than the other biasing schemes. As one example, when operated with a biasing scheme of a positive switching voltage of about 1.8V and a negative switching voltage of about −1.2V, the ferroelectric memory cell exhibited a substantially flat signal during the operating life of the memory cell and exhibited reduced fatigue characteristics, even up until about $10^{10}$ cycles. The asymmetric biasing scheme may, thus, reduce power consumption and maintain desirable performance. Accordingly, a strong signal may be achieved while also reducing the fatigue properties of the ferroelectric memory cell.

Accordingly, in one embodiment, a method of operating a method of operating a ferroelectric memory cell comprises applying one of a positive bias voltage and a negative bias voltage to a ferroelectric memory cell comprising a capacitor including a top electrode, a bottom electrode, a ferroelectric material between the top electrode and the bottom electrode, and an interfacial material between the ferroelectric material and one of the top electrode and the bottom electrode, and applying another of the positive bias voltage and the negative bias voltage to the ferroelectric memory cell to switch a polarization of the ferroelectric memory cell, wherein an absolute value of the negative bias voltage is different from an absolute value of the positive bias voltage.

Accordingly, in another embodiment a method of operating a ferroelectric memory cell comprises applying one of a positive bias voltage and a negative bias voltage to a ferroelectric capacitor comprising a first electrode, an interfacial material between the first electrode and a ferroelectric material, and a second electrode adjacent the ferroelectric material, and applying another of the positive bias voltage and the negative bias voltage to the ferroelectric capacitor, the negative bias voltage having a different magnitude than the positive bias voltage.

Operating an asymmetric ferroelectric memory cell with an asymmetric biasing scheme may reduce power consumption used during operation of the asymmetric ferroelectric memory cell, reduce signal peaking, and reduce frequency-dependent signal loss. Under such an operating scheme, the ferroelectric memory cell may not be over-driven and may be configured to operate for a longer period of time before breaking down. The ferroelectric memory cell may include a top electrode and a bottom electrode having different thicknesses, formed from different materials, formed by different processing conditions, or combinations thereof. The ferroelectric materials may include hafnium oxide, zirconium oxide, or a combination thereof. An interfacial material may be disposed between the ferroelectric material and one of the top electrode and the bottom electrode.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A method of operating a ferroelectric memory cell, the method comprising:
   applying one of a positive bias voltage and a negative bias voltage to a ferroelectric memory cell comprising a capacitor including a top electrode, a bottom electrode, a ferroelectric material between the top electrode and the bottom electrode, and an interfacial material between the ferroelectric material and one of the top electrode and the bottom electrode; and
   applying another of the positive bias voltage and the negative bias voltage to the ferroelectric memory cell to switch a polarization of the ferroelectric memory cell, wherein an absolute value of the negative bias voltage is different from an absolute value of the positive bias voltage.

2. The method of claim 1, wherein applying one of a positive bias voltage and a negative bias voltage comprises applying the negative bias voltage having an absolute value equal to less than about two-thirds an absolute value of the positive bias voltage.

3. The method of claim 1, wherein applying one of a positive bias voltage and a negative bias voltage to a ferroelectric memory cell comprises applying one of the positive bias voltage and the negative bias voltage to the top electrode of the ferroelectric memory cell, the top electrode having a different thickness than the bottom electrode.

4. The method of claim 1, wherein applying one of a positive bias voltage and a negative bias voltage to a ferroelectric memory cell comprises applying one of the positive bias voltage and the negative bias voltage to a ferroelectric memory cell comprising an interfacial material comprising titanium aluminum nitride or titanium oxide.

5. The method of claim 1, wherein applying one of a positive bias voltage and a negative bias voltage to a ferroelectric memory cell comprises applying one of the positive bias voltage and the negative bias voltage to a ferroelectric memory cell comprising titanium aluminum nitride as one of the bottom electrode or the top electrode.

6. The method of claim 5, wherein applying one of a positive bias voltage and a negative bias voltage to a ferroelectric memory cell comprises applying one of the positive bias voltage and the negative bias voltage to a ferroelectric memory cell comprising titanium nitride as the other of the bottom electrode and the top electrode.

7. The method of claim 5, wherein applying one of a positive bias voltage and a negative bias voltage to a ferroelectric memory cell comprises applying one of the positive bias voltage and the negative bias voltage to a ferroelectric memory cell comprising an interfacial material comprising aluminum nitride.

8. The method of claim 1, wherein applying one of a positive bias voltage and a negative bias voltage to a ferroelectric memory cell comprises applying one of the positive bias voltage and the negative bias voltage to a ferroelectric memory cell comprising at least one of hafnium oxide and zirconium oxide between the top electrode and the bottom electrode.

9. A method of operating a ferroelectric memory cell, the method comprising:
   applying one of a positive bias voltage and a negative bias voltage to a ferroelectric capacitor comprising a first electrode, an interfacial material between the first electrode and a ferroelectric material, and a second electrode adjacent the ferroelectric material; and applying another of the positive bias voltage and the negative bias voltage to the ferroelectric capacitor, the negative bias voltage having a different magnitude than the positive bias voltage.

10. The method of claim 9, wherein applying one of a positive bias voltage and a negative bias voltage comprises applying a negative bias voltage having a magnitude of between about one-half and about two-thirds a magnitude of the positive bias voltage.

11. The method of claim 9, wherein applying one of a positive bias voltage and a negative bias voltage to a ferroelectric capacitor comprises applying the positive bias voltage to a ferroelectric capacitor having a positive remnant polarization that is different from a negative remnant polarization.

12. The method of claim 9, wherein:
applying one of a positive bias voltage and a negative bias voltage comprises applying a positive voltage of about 1.8V; and
applying another of the positive bias voltage and the negative bias voltage comprises applying a negative bias voltage of about −1.2V.

13. The method of claim 9, wherein applying one of a positive bias voltage and a negative bias voltage to a ferroelectric capacitor comprises switching a polarization direction of a ferroelectric material comprising hafnium oxide, zirconium oxide, or a combination thereof.

14. The method of claim 9, wherein applying one of a positive bias voltage and a negative bias voltage to a ferroelectric capacitor comprises applying one of the positive bias voltage and the negative bias voltage to a ferroelectric capacitor comprising a first electrode comprising titanium aluminum nitride and an interfacial material comprising aluminum nitride.

15. The method of claim 9, further comprising altering at least one of the positive bias voltage and the negative bias voltage after a predetermined number of cycles.

16. A ferroelectric memory cell, comprising:
a capacitor overlying a conductive material in contact with at least one of a source region and a drain region of a semiconductor substrate, the capacitor comprising:
a first electrode comprising titanium aluminum nitride;
a ferroelectric material comprising hafnium oxide, zirconium oxide, or a combination thereof;
an interfacial material between the first electrode and the ferroelectric material; and
a second electrode comprising titanium nitride over the ferroelectric material.

17. The ferroelectric memory cell of claim 16, wherein the first electrode comprises a different thickness than the second electrode.

18. The ferroelectric memory cell of claim 16, wherein the ferroelectric material comprises hafnium oxide.

19. The ferroelectric memory cell of claim 16, wherein the interfacial material comprises aluminum nitride.

20. The ferroelectric memory cell of claim 16, wherein the interfacial material comprises titanium oxide.

21. The ferroelectric memory cell of claim 16, wherein the interfacial material directly overlies and contacts the first electrode.

22. The ferroelectric memory cell of claim 16, wherein the interfacial material comprises an oxide of a material of the first electrode.

23. The ferroelectric memory cell of claim 16, wherein the ferroelectric material directly overlies and contacts the interfacial material.

* * * * *